(12) United States Patent
Youssefi

(10) Patent No.: US 8,963,575 B2
(45) Date of Patent: Feb. 24, 2015

(54) ANALOG MAJORITY VOTE CIRCUIT

(71) Applicant: SanDisk Technologies Inc., Plano, TX (US)

(72) Inventor: Behdad Youssefi, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 11 days.

(21) Appl. No.: 13/627,154

(22) Filed: Sep. 26, 2012

(65) Prior Publication Data

US 2014/0084959 A1 Mar. 27, 2014

(51) Int. Cl.
H03K 19/003 (2006.01)
H03K 19/23 (2006.01)

(52) U.S. Cl.
CPC ....................... *H03K 19/23* (2013.01)
USPC .............................. 326/13; 326/36

(58) Field of Classification Search
CPC ..................................................... H03K 19/23
USPC ............................ 326/9–14, 35–36
See application file for complete search history.

(56) References Cited

U.S. PATENT DOCUMENTS

| | | | | |
|---|---|---|---|---|
| 4,617,475 | A * | 10/1986 | Reinschmidt | 326/11 |
| 5,838,166 | A * | 11/1998 | Nakamura | 326/36 |
| 7,236,005 | B1 * | 6/2007 | Yee et al. | 326/36 |
| 7,406,608 | B2 | 7/2008 | Joshi | |
| 7,616,133 | B2 | 11/2009 | Hollis | |
| 8,476,924 | B2 * | 7/2013 | Choi et al. | 326/36 |
| 8,767,483 | B2 * | 7/2014 | Brown et al. | 365/189.07 |
| 2004/0068594 | A1 | 4/2004 | Asaro et al. | |
| 2005/0188282 | A1 * | 8/2005 | Joshi | 714/43 |
| 2006/0061382 | A1 * | 3/2006 | Ye et al. | 326/11 |
| 2007/0069589 | A1 * | 3/2007 | Oh et al. | 307/112 |
| 2008/0001626 | A1 * | 1/2008 | Bae et al. | 326/36 |
| 2010/0141296 | A1 * | 6/2010 | Wood et al. | 326/11 |
| 2010/0148819 | A1 * | 6/2010 | Bae et al. | 326/36 |
| 2014/0062529 | A1 * | 3/2014 | Ramachandra | 326/35 |

OTHER PUBLICATIONS

Stan et al., "Bus-Invert Coding for Low-Power I/O," *IEEE Transactions on Very Large Scale Integration (VLSI) Systems*, vol. 3, No. 1, Mar. 1995, pp. 49-58.

Chapter 8 Datapath Units: Multiplier Design, *Naitonal Taiwan University*, Jun. 12, 2002, access.ee.ntu.edu.tw/course/VLSI_design_90second/pdf/slide/Chap-8%20Multiplier%20(06-14-2002).ppt, pp. 1-25.

Bae et al., "An 80 nm 4 Gb/s/pin 32 Bit 512 Mb GDDR4 Graphics DRAM with Low Power and Low Noise Data Bus Inversion," IEEE Journal of Solid-State Circuits, vol. 43, No. 1, Jan. 2008, pp. 121-131.

* cited by examiner

*Primary Examiner* — Jason M Crawford
(74) *Attorney, Agent, or Firm* — Davis Wright Tremaine LLP

(57) ABSTRACT

An analog majority voting circuit is formed of a cascade of two differential amplifiers and decouples heavily loaded nodes from a high voltage swing nodes, delivering high bandwidth while maintaining relatively high gain. A first stage's differential amplifier receives a first set of n input and a second set of n inputs and generates from these first and second intermediate outputs with a high capacitive load and low swing. These intermediate outputs are then the inputs for a second stage's differential amplifier, providing a low capacitive load, high swing output that can then be fed to an inverter for the final output of the voter.

14 Claims, 5 Drawing Sheets

ANALOG MAJORITY VOTE CIRCUIT

BACKGROUND

This application relates to majority vote circuits, and to their use in various applications including bus inversion circuits.

Majority vote circuits are common circuits that have many applications. A majority vote circuit receives multiple bits and determines whether there are more logic "0" bits, or more logic "1" bits. Such bits are generally received through conductive lines that may have a higher voltage, or lower voltage, designating "0" or "1". Assignment of a logic state to a voltage is arbitrary (i.e. high voltage could correspond to "0" and low voltage to "1" or vice versa). A majority vote circuit gives an output that reflects whether the majority of inputs are high or low. Typically, there is an even number of inputs so that there can be an equal number of bits in each logic state and this case may be provided for by having a tie-breaker of some sort so that the output in this case is predetermined as either a "0" or a "1."

FIG. 1 shows a simple illustration of a prior art majority vote circuit. Multiple individual conductors (n conductors in this example) form a parallel communication channel that provides an input to the majority vote circuit. For example, 8 conductors may provide an 8-bit (one byte) input. Such a parallel input provides one byte at a time as a data word. Typically, one data word is provided at each clock cycle, though higher data rates are possible. The majority vote circuit generates an output (O/P) that indicates the majority logic state for a particular data word.

FIG. 2 shows an example of a prior art digital majority vote circuit that uses full adders to add together nine inputs and provide an output that is high if five or more of the nine inputs are high. However, such digital circuits are generally slow and cannot generate the output in a single clock cycle. Thus, such digital circuits may be unsuitable for high-speed applications.

FIG. 3 shows an example of an analog majority vote circuit where individual inputs are combined at a common node which is pulled to a high or low voltage according to the majority of inputs provided. This node is compared with a threshold voltage by a comparator. The value of the threshold voltage may be selected so that an output remains low when the number of high inputs is four or fewer. When five or more inputs are high, the common node reaches a voltage that exceeds the threshold voltage and the comparator output changes. However, while such analog majority vote circuits may be relatively fast, they are not accurate or reliable especially for a large numbers of inputs. Analog majority vote circuits may also consume significant power.

Conventional majority vote circuits suffer from several drawbacks including speed, reliability, and size. Therefore, there is a need for fast, reliable, small majority vote circuits.

SUMMARY

According to a general aspect, a majority voting circuit includes a first and a second differential amplifier. The first differential amplifier is connected to receive a first n-bit input signal at a first n-bit input and a second n-bit input signal at a second n-bit input and respectively generate therefrom first and second intermediate outputs, where n is an integer greater than one. The second differential amplifier is connected to respectively receive at first and second inputs the first and second intermediate outputs of the first differential amplifier and determine therefrom as output a majority vote value.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Figure 1:
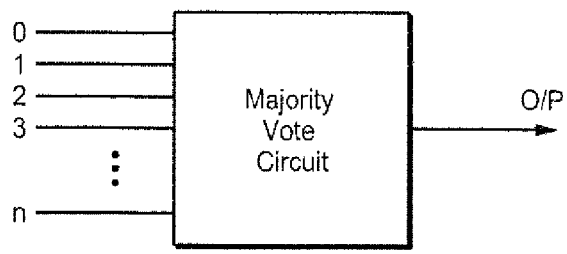
FIG. 1 illustrates a prior art majority vote circuit.
Figure 2:
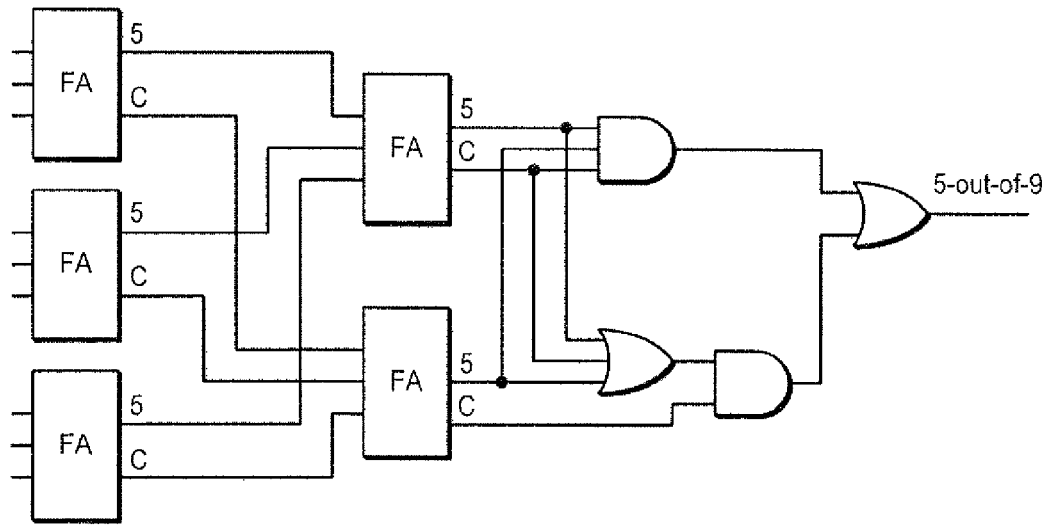
FIG. 2 illustrates an example of a prior art digital majority vote circuit.
Figure 3:
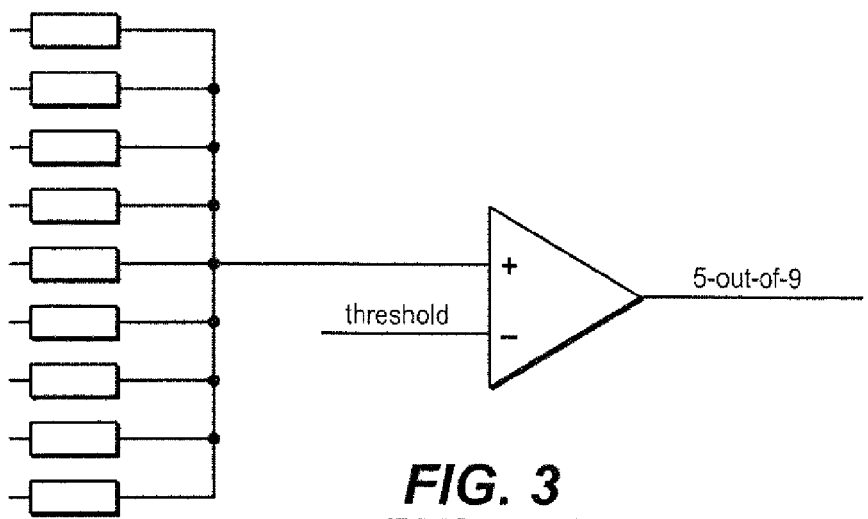
FIG. 3 illustrates an example of a prior art analog majority vote circuit.
Figure 4:
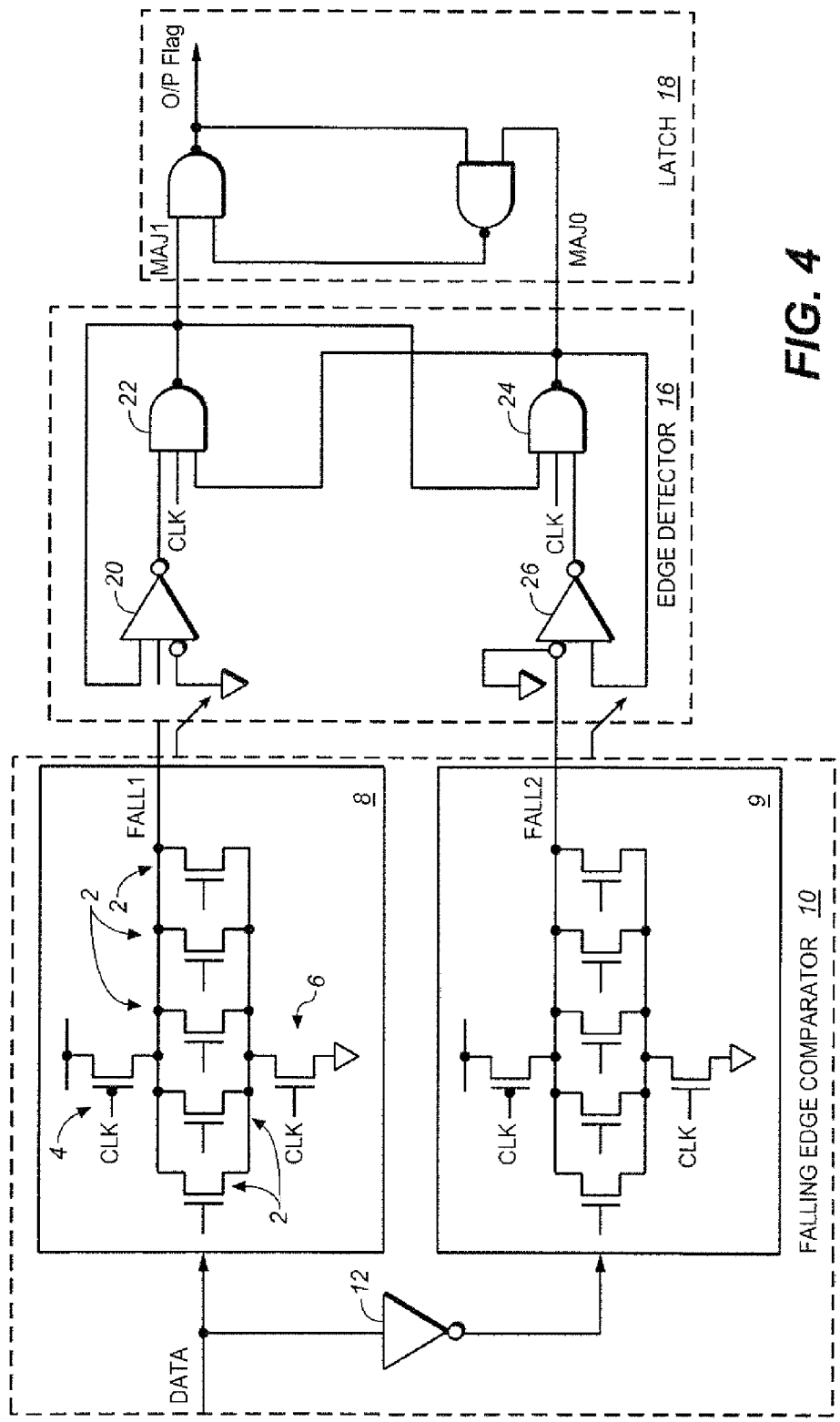
FIG. 4 illustrates a majority vote circuit using an edge detector.

FIG. 4 illustrates a majority vote circuit that includes a falling edge comparator 10 that has a precharge phase and an evaluation phase. The comparator 10 includes an upper block 8 formed by transistors 2 that are connected in parallel between a supply voltage (e.g. Vcc) and a common voltage (e.g. ground) with control transistors connected to alternately connect the transistors to the supply voltage and to the common voltage. In the example shown, the control transistors are a PMOS transistor 4 and an NMOS transistor 6, that are both controlled by the same clock signal (CLK) so that one is on while the other is off. When the clock signal is low, the PMOS transistor is turned on, and the supply voltage is connected to the upper terminal of the transistors thus precharging the line connecting the upper terminals of transistors 2 to the supply voltage (the NMOS transistor 6 is "off" during this time). This period, the low phase of the clock cycle, may be considered a precharge phase. Data may be loaded into latches connected to the gates of the transistors during this phase.

When the clock signal (CLK) goes high, the PMOS transistor 4 turns off and the NMOS transistor 6 turns on, thus allowing current to flow through the transistors 2. Data latches containing the data to be analyzed are connected to the gates of the transistors 2 so that each data bit controls a transistor (e.g. turning transistor on or off depending on logic state). Current flow through transistors 2 is proportional to the number of transistors that are turned on. Thus, discharge time is inversely proportional to the number of transistors that are turned on. This period, the high phase of the clock cycle, may be considered an evaluation phase during which the current flow, or discharge time, allows evaluation of the data.

Falling edge comparator 10 also includes a second block 9 that is identical to the first block 8. The second block receives the inverse of the data to be analyzed (i.e. each bit is inverted) from an inverter 12 (which may be considered part of the second block, or as a separate component). The inverted data is loaded in block 9 during the precharge cycle so that both data in block 8 and inverted data in block 9 are loaded during pre-charge. Then, during the evaluation phase, this data is applied to gates of the transistors of block 9 where it allows discharge at a rate that is proportional to the number of transistors that are turned on by the inverted data.

It can be seen that during the evaluation phase, one block of transistors will tend to discharge more quickly than the other block depending on how many data bits correspond to a particular logic state. Taking a simple example of four bits, where a logic state "1" in a data latch causes the corresponding transistor to turn on, it can be seen that data word 1000 would turn on one of four transistors, while its inverse 0111 would turn on three of four transistors. Thus, the inverted data would provide a more rapid discharge. By comparing discharge times, the majority logic state may be determined. The two blocks may be thought of as being in a race to discharge with the winner indicating the majority logic state. In some cases, an extra transistor may be added to one of the blocks to act as a tie-breaker so that if the data is split evenly, that block wins, thus avoiding a random result if both blocks discharged at the same rate.

In addition to the falling edge comparator 10, an edge detector 16 is provided to determine which block is first to discharge and an output latch 18 is provided to latch the result. The edge detector 16 receives an input from each of the precharged lines connecting the upper terminals of the transistors. These inputs are used to detect falling edges and the inputs are labeled as FALL0 and FALL1. These two falling edge inputs are used to determine the output of the output latch 18 as illustrated by the timing diagram of FIG. 5. In particular, when a first falling edge enters one of the inverting amplifiers of edge detector 16, it causes the output of that amplifier to go from low to high. This output is provided to a corresponding NAND gate which then goes from high to low.

Figure 5:
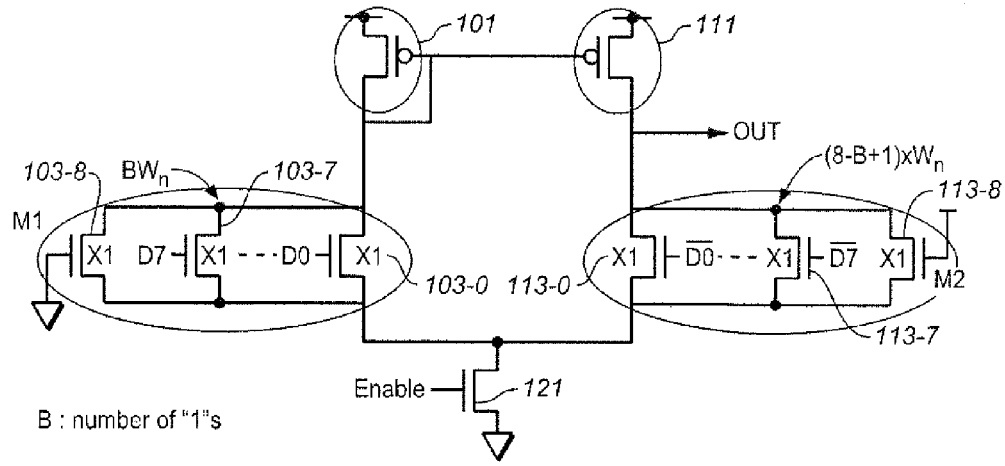
FIG. 5 shows another example of an analog majority vote circuit.

While the circuit of FIG. 4 provides an accurate majority vote it may not be suitable for all applications. In particular, where a parallel communication channel has a relatively high clock frequency there is little time to perform precharge and evaluation. FIG. 5 shows a clock cycle of tclk with just tclk/2 for evaluation and tclk/2 for precharge. In high-frequency interfaces, the period, tclk, may be very short so that tclk/2 is insufficient to ensure complete precharging and/or reliable evaluation.

In addition to the difficulty of performing these operations in such short time is the added problem of variability in some clock signals. While a clock frequency is generally specified with precision, the duty cycle of a clock signal may vary widely. For example, a memory interface standard may specify a 5ns cycle time but allows a duty cycle of 40% (nominal duty cycle 50%). This means that there may be only 2 ns for a given operation instead of the nominal time of 2.5 ns. The time available may vary as the duty cycle varies within the specified limits. This means that such a circuit may be designed for a worst-case scenario (e.g. 2 ns) making it even more difficult than the nominal value would indicate. Thus, operating a majority vote circuit in a manner that depends on the duty cycle is problematic where the duty cycle is not reliable.

The operation of the circuit of FIG. 4 is discussed further in U.S. patent application Ser. No. 13/598,440, that also presents a digital majority voting circuit that overcomes many of this difficulties.

Analog Majority Voting Circuits

FIG. 5 shows an example of an analog majority voting circuit. A pair of PMOS transistors 101 and 103 are connected as a current mirror and respectively feed left and right legs. The left and right legs each have, in this example, eight inputs, D0-D7 and Dn0-Dn7, respectively, connect to the gates of same sized (X1) transistors 103-0 to 103-7 and 113-0 to 113-7, where each set is connected in parallel to ground through the enable transistor 121. In this example, the left and right legs also have a ninth transistor M1 103-8 and M2 113-8, respectively, with gates (again respectively) connected to ground and the supply level, which act as a "tie-breaker" in a 4-4 voting situation. Although this circuit provides an analog majority vote between the D and Dn values, it has a number of features that could be improved upon.

One less than desirable feature is that the design of FIG. 5 has a large number input devices and these devices need to be large in order to reduce mismatch in the current mirror that will heavily load the output node. Another problem is the combination of a heavily loaded output together with large voltage swings at the output makes this circuit very slow and very power hungry. Also, as there is no current limitation, the power consumption of the circuit in FIG. 5 is undefined and dependent on data pattern, process, and temperature. Consequently, this circuit is subject to very large DC current draws and switching currents. The design of FIG. 5 also has highly variable performance across process voltage and temperature (PVT) corners.

Figure 6:
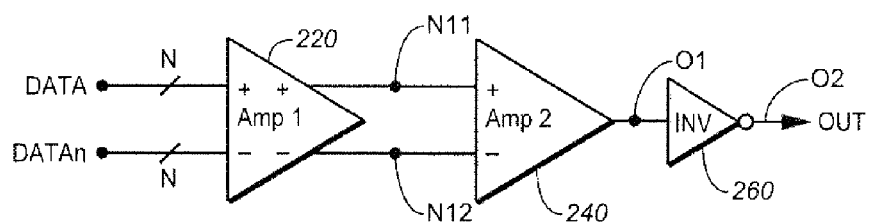
FIG. 6 is an implementation of an exemplary embodiment for an analog majority vote circuit.

To improve this situation, a primary aspect of the exemplary embodiments is to use a cascade of two differential amplifiers to decouple the heavily loaded node from the high voltage swing node, thus delivering a very high bandwidth while maintaining relatively high gain. This sort of division of labor allows for an analog majority vote approach with fully differential first stage as a detector in a design that consumes less power and can deliver very high speed. The resultant design is also very stable across process voltage and temperature (PVT) corners. FIG. 6 illustrates some of the general features.

As shown in FIG. 6, the majority voting circuit has a first differential amplifier stage AMP 1 220 that receives the N-bit wide DATA at a first input (here the +) and the N-bit wide DATAn at the second input (here the −). From these inputs, the AMP 1220 generates the respective outputs N11 and N22 at the correspondingly labeled intermediate nodes. These high capacitive load, low voltage swing intermediate nodes then server as the inputs for a second differential amplifier AMP2 240. The intermediate nodes N11 and N12 are connected to the two inputs (here respectively +, −) of AMP2 240, which in turn has the low capacitive load, high voltage swing output O1 as the result of the vote at the similarly labeled node. In this example, the output O1 is than fed through inverter INV 260 to provide the final output of the circuit at O2.

Figure 7:
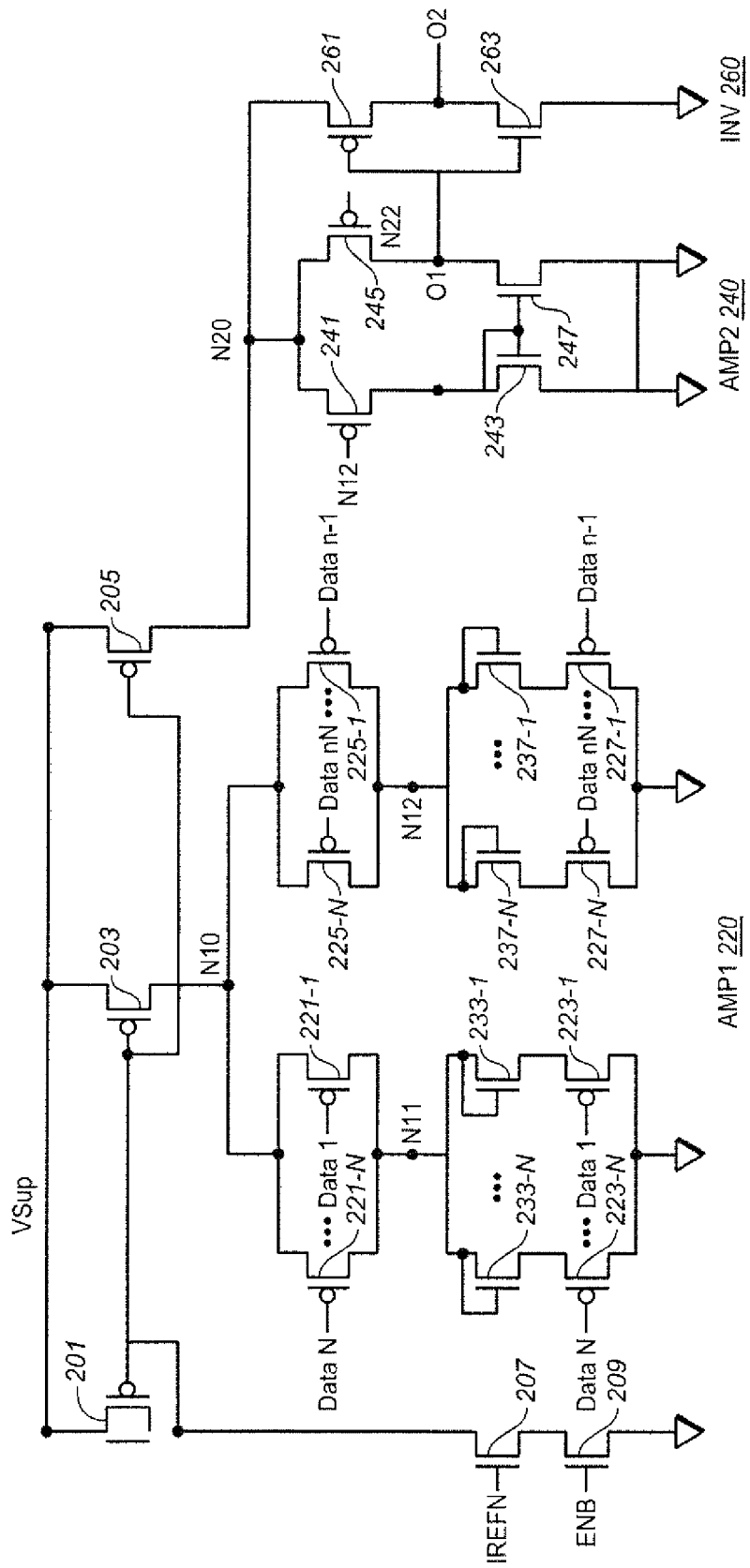
FIG. 7 is a more detail version of FIG. 6.

FIG. 7 is a more detailed representation for one implementation of FIG. 6. In FIG. 7, the elements making up AMP1 220 are supplied from a node N10 and the elements making up AMP2 240 and INV 260 are supplied from a node N20. The nodes N10 and N20 are in turn provided from the supply level VSUP through some biasing circuitry. This includes a first PMOS 201 connected in series between VSUP and ground through an enable transistor 209 with input ENB and a transistor 207 to set the bias level based on the value of the input IREFN. The PMOS 201 is diode connected to allow it to be mirrored by PMOS 203 and PMOS 205 that respectively provide N10 and N20. In the exemplary embodiment, PMOS 203 and PMOS 205 are designed to be of the same size.

Going to the left side of FIG. 7, INV 260 is formed of PMOS 261 connected in series with NMOS 263 between N20 and ground. The gates of both of these are connected to the output O1 of AMP2 240; and the output of INV 260 is taken from the node O2 between the two transistors.

AMP 2 240 has first and second legs connected in parallel between N20 and ground. The left leg has PMOS 241 connected in series NMOS 243 and the right leg has PMOS 245-connected in series with NMOS 247, where the output O1 is taken from a node in the right leg between this last pair. The gates of PMOS 241 and PMOS 245 are connected to the outputs of AMP 1 220, N12 and N11 respectively. NMOS 243 and NMOS 247 are connected as a current mirror, with their gates connected to a node between PMOS 241 and NMOS 243. In the exemplary embodiment, PMOS 241 and PMOS 245 can be low Vt devices.

AMP 220 also has right and left legs, here respectively connected to receive the N inputs DATA and DATAn and, again respectively, provide the intermediate outputs N11 and N12. In the right leg, PMOSs 221-$i$ are connected in parallel between N10 and N11 with their gates connected to the inputs DATA-$i$, where i runs from 1 to N. Similarly, in the left leg PMOSs 225-$i$ are connected in parallel between N10 and N12 with their gates connected to the inputs DATAn-$i$, where i runs from 1 to N. Connected in parallel between ground and the intermediate notes N11 and N12 are respectively NMOSs 223-$i$, with their gates connected to the inputs DATA-$i$, and NMOSs 227-$i$, with their gates connected to the inputs DATAn-$i$, where i again runs from 1 to N. Each of the NMOSs 223-$i$ and NMOSs 227-$i$ is here connected to N11 or N12 through a corresponding diode 233-$i$ and 237-I, helping to convert the current in each branch into a voltage that can then be magnified in the next stage by AMP2 240. In the exemplary embodiment, these diodes can be formed from low Vt transistors.

The analog majority voting circuit of FIGS. 6 and 7 is very robust and fast relative to earlier approaches. The use of the current sources helps to make its power consumption independent of process voltage and temperature (PVT) corners and data pattern. Relative to digital majority voting circuits, it can provide similar performance and current consumption, but with much higher stability across PVT. Another advantage is that it is highly scalable: since there is not feedback in the circuit, it can be made as fast as desired by burning more current, whereas designs such as in FIG. 4 have their speed limited by the latch structure.

Application to Bus Inversion

Figure 8:
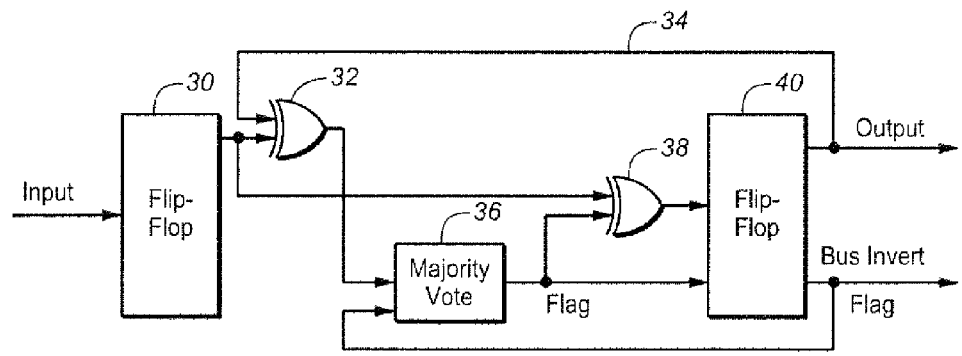
FIG. 8 illustrates an AC bus inversion circuit using a majority vote circuit.
Figure 9:
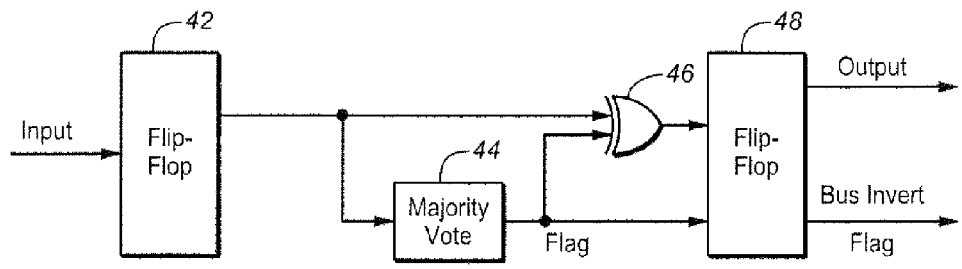
FIG. 9 illustrates a DC bus inversion circuit using a majority vote circuit.

One set of applications for a majority voting circuit is for use in bus inversion. FIG. 9 shows one application for a majority vote circuit such as described above in an AC Bit Inversion (BI) circuit. The aim of AC BI is to reduce the number of transitions (i.e. "1" to "0" or "0" to "1") from one data word to the next by inverting data when inversion would provide a smaller number of transitions. This reduces Simultaneous Switching Noise (SSN) by limiting the number of transitions in same direction to N/2 for an N-bit data that is a 50% max reduction of SSN. In addition AC BI also helps reduce AC switching power as total transitions are also reduced to N/2. In particular, FIG. 8 shows an input, which may be a series of data words provided by a parallel communication channel, is initially latched in a flip-flop 30, then supplied to an XOR gate 32 where a data word is XORed with a previous data word provided by a feedback line 34 from a data output. Thus, the output of XOR gate 32 is a data word in which a "1" indicates a transition. If the number of "1"s is more than half the data word (e.g. more than four "1"s in a byte) then inversion would be beneficial. In order to determine the number of "1"s, a majority vote circuit is provided that counts the "1"s in the output from the XOR, accounts for any transition in the bus inversion flag itself, and provides an output flag indicating whether inversion is beneficial. The inversion flag is generated and is supplied to another XOR gate 38 where, if the flag is high, it causes the data word to be inverted (if the flag is low, data passes through). The data is latched in an output flip-flop 40 along with the bus invert flag and provided as an output of the circuit.

Relating the AC bus inversion back to the inputs of FIGS. 6 and 7, this means that of the N data inputs of DATA, (N−1) of the these will correspond to the data currently on the but XORed with the next set of data to go out on to the bus. The Nth input is to take into account the level of the bus inversion signal itself. For DATAn, these can be hard-wired as the basis for the decision, typically half to the high level and half to the low level to see if the more than half of the entries are changing, although other values can be used.

Figure 10:
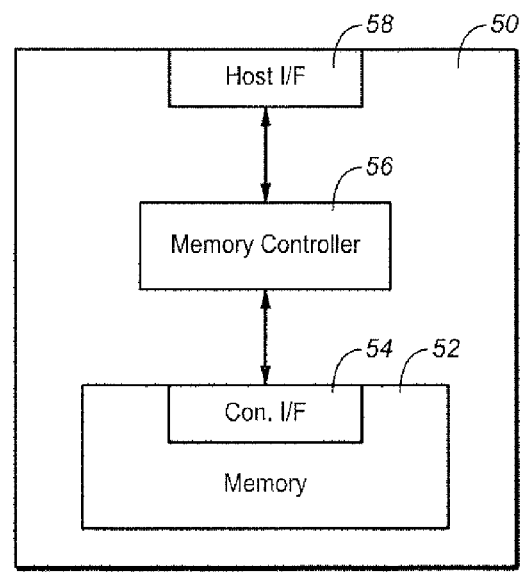
FIG. 10 shows a flash memory system using a majority vote circuit for bit inversion.

FIG. 9 shows another application for a majority vote circuit such as described above. In this case the majority vote circuit is used in a DC bus inversion circuit, where the main concern it to have the minimum number of high signals on the bus (or bus plus bus inversion signal) in order to reduce the DC current on the bus. DC BI also helps reduce SSN as the number of transitions in same direction can be restricted to N/2 which is a 50% max SSN reduction. DC BI is useful in cases where DC current is concern. If a "0" consumes DC current then DC BI may be employed to limit the number of "0"s. In FIG. 10A incoming data is latched in a data input flip-flop 42, then the majority vote circuit 44 determines whether there are more "0"s than "1"s. If there are more "0"s then an output flag goes high and causes an XOR gate 46 to invert the data (if the output flag is low, then the data passes through). The data is then latched in a data output flip-flop 48. Relating the DC bus inversion back to the inputs of FIGS. 6 and 7 are then the data to go onto the bus on one side, and its inverse on the other side. An additional input can also be added to each side as shown in FIG. 5 for M1 103-8 and M2 113-8

FIG. 11 shows a typical nonvolatile memory system 50 such as a memory card, USB thumb drive, Solid State Drive, or other memory system. A memory 52, which may include one or more memory chips, such as NAND flash memory chips, has a controller interface 54 for communication with a memory controller 56. AC or DC bus inversion may be performed in the controller interface 54 to reduce SSN or power consumption. Alternatively, bus inversion may be performed in the memory controller 56, or in the host interface 58. In some cases, more than one bus inversion operation may be performed in such a nonvolatile memory system.

Conclusion

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A majority voting circuit comprising:
   a first stage including a differential amplifier having a first input for a first n independent bits of data, a second input for a second n independent bits of data and first and second outputs for respectively providing first and second intermediate outputs, the first stage's differential amplifier being connectable to receive a first input signal of n independent bits at the first input and generate therefrom the first intermediate output and to receive a second input signal of n independent bits at the second n-bit input and generate therefrom the second intermediate output, where n is an integer greater than one; and a second stage including a differential amplifier connected to respectively receive at first and second inputs the first and second intermediate outputs of the first differential amplifier and determine therefrom as output a majority vote value.

2. The majority voter circuit of claim 1, wherein the outputs of the first stage's differential amplifier are of lower swing than the output of the second stage's differential amplifier.

3. The majority voter circuit of claim 1, wherein the output of the second stage's differential amplifier has a lower capacitive load than the outputs of the first stage's differential amplifier.

4. The majority voting circuit of claim 1, wherein at least one of the first and second input signals are based on the content of a multi-bit data bus and the majority vote value is used to determine whether to invert the data bus's signals.

5. The majority voting circuit of claim 4, wherein the majority vote value is used to determine whether to perform a DC bus inversion.

6. The majority voting circuit of claim 4, wherein the first input signal includes the data of the data bus and the second input signal includes the data of the data but in inverted form.

7. The majority voting circuit of claim 6, wherein the data bus is (n–1) bits wide, (n–1) of the first input signal are the (n–1) data bits on the bus and the n-th first input is ground, and (n–1) of the second input signal are the inverted form of the (n–1) data bits on the bus and the n-th second input is the first supply level.

8. The majority voting circuit of claim 4, wherein the majority vote value is used to determine whether to perform an AC bus inversion.

9. The majority voting circuit of claim 1, further comprising:
an inverter through which is provided the output of the majority voter circuit and whose input is connected to the second differential amplifiers to receive the output thereof.

10. A majority voting circuit comprising:
a first differential amplifier connected to receive a first n-bit input signal at a first n-bit input and a second n-bit input signal at a second n-bit input and respectively generate therefrom first and second intermediate outputs, where n is an integer greater than one; and
a second differential amplifier connected to respectively receive at first and second inputs the first and second intermediate outputs of the first differential amplifier and determine therefrom as output a majority vote value,
wherein the first differential amplifier includes:
a first leg connected between a first supply level and ground, including:
a first set of n p-type transistors connected in parallel between the first supply level and a first intermediate node and each having one of the first input signals connected to the gate thereof; and
a second set of n n-type transistors connected in parallel between the first intermediate node and ground and each having one of the first input signals connected to the gate thereof, wherein each transistor of the second set is connected to the first intermediate node through one of n corresponding diodes, and
a second leg connected between the first supply level and ground in parallel with first leg, including:
a first set of n p-type transistors connected in parallel between the first supply level and a second intermediate node and each having one of the second input signals connected to the gate thereof; and
a second set of n n-type transistors connected in parallel between the second intermediate node and ground and each having one of the second input signals connected to the gate thereof, wherein each transistor of the second set is connected to the first intermediate node through a corresponding diode,
wherein the first and second intermediate outputs are respectively taken from the first and second intermediate nodes.

11. The majority voting circuit of claim 10, further comprising:
a current mirror including first and second mirroring transistors providing mirrored currents from a voltage supply level, the first supply level being provided by the first mirror transistor and the second differential amplifier being supplied by the second mirroring transistor.

12. The majority voting circuit of claim 11, wherein the second differential amplifier includes:
a first leg connected between the second mirroring transistor and ground, including:
a p-type transistor connected between the second mirroring transistor and an first intermediate node and having a gate connected to the first input of the second differential amplifier; and
an n-type transistor connected between the first intermediate node and ground and having a gate connected to the first intermediate node; and
a second leg connected between the second mirroring transistor and ground in parallel with first leg, including:
a first p-type transistor connected the second mirroring transistor and a second intermediate node and having a gate connected to the second input of the second differential amplifier; and
an n-type transistors connected between the second intermediate node and ground and having a gate connected to the first intermediate node,
wherein the output of the second differential amplifier is taken from the second intermediate node.

13. A majority voting circuit comprising:
a first differential amplifier connected to receive a first n-bit input signal at a first n-bit input and a second n-bit input signal at a second n-bit input and respectively generate therefrom first and second intermediate outputs, where n is an integer greater than one; and
a second differential amplifier connected to respectively receive at first and second inputs the first and second intermediate outputs of the first differential amplifier and determine therefrom as output a majority vote value,
wherein at least one of the first and second n-bit inputs are based on the content of a multi-bit data bus and the majority vote value is used to determine whether to invert the data bus's signals, and
wherein the first n-bit input includes the data of the data bus for the current clock cycle XOR-ed with the data of the bus for the next data cycle and the second n-bit input includes values hardwired to one or either the first supply level or ground.

14. The majority voting circuit of claim 13, wherein the data bus is (n−1) bits wide, (n−1) of the first n-inputs are the (n−1) data bits on the bus for the current clock cycle XORed with the data of the bus for the next data cycle and the n-th first input is based on the previous output of the majority voting circuit.

\* \* \* \* \*